United States Patent
Wu et al.

(10) Patent No.: US 10,038,015 B2
(45) Date of Patent: Jul. 31, 2018

(54) ARRAY SUBSTRATE AND FABRICATION METHOD THEREOF, DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Tianyi Wu, Shanghai (CN); Jun Ma, Xiamen (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/475,223

(22) Filed: Mar. 31, 2017

(65) Prior Publication Data
US 2017/0207246 A1    Jul. 20, 2017

(30) Foreign Application Priority Data
Nov. 18, 2016 (CN) .......................... 2016 1 1025995

(51) Int. Cl.
*H01L 27/12* (2006.01)
*H01L 21/02* (2006.01)
*H01L 29/786* (2006.01)
*H01L 27/32* (2006.01)
*H01L 21/77* (2017.01)

(52) U.S. Cl.
CPC ...... *H01L 27/1225* (2013.01); *H01L 21/0262* (2013.01); *H01L 21/02274* (2013.01); *H01L 21/02532* (2013.01); *H01L 21/02592* (2013.01); *H01L 27/127* (2013.01); *H01L 27/1237* (2013.01); *H01L 27/1251* (2013.01); *H01L 27/1262* (2013.01); *H01L 27/3262* (2013.01); *H01L 29/7869* (2013.01); *H01L 29/78669* (2013.01); *H01L 2021/775* (2013.01)

(58) Field of Classification Search
CPC ............. H01L 27/1251; H01L 27/1229; H01L 27/1237; H01L 27/283; H01L 27/3274
See application file for complete search history.

(56) References Cited

U.S. PATENT DOCUMENTS

2016/0063924 A1* 3/2016 Oh ...................... H01L 27/1229
345/690
2017/0193947 A1* 7/2017 Kim ..................... G09G 3/3677

FOREIGN PATENT DOCUMENTS

CN           104538352 A      4/2015

* cited by examiner

*Primary Examiner* — Olik Chaudhuri
*Assistant Examiner* — Changhyun Yi
(74) *Attorney, Agent, or Firm* — Anova Law Group, PLLC

(57) ABSTRACT

An array substrate, a display panel, and a fabrication method of the array substrate are provided. The array substrate comprises a first thin film transistor including a metal oxide thin film transistor, and a second thin film transistor including an amorphous silicon thin film transistor. The first thin film transistor and the second thin film transistor are disposed above a substrate. The first thin film transistor is located in a display region of the array substrate, and the second thin film transistor is located in a peripheral circuit region of the array substrate.

12 Claims, 10 Drawing Sheets

ARRAY SUBSTRATE AND FABRICATION METHOD THEREOF, DISPLAY PANEL

CROSS-REFERENCES TO RELATED APPLICATIONS

This application claims priority of Chinese Patent Application No. 201611025995.2, filed on Nov. 18, 2016, the entire contents of which are hereby incorporated by reference.

FIELD OF THE DISCLOSURE

The present disclosure generally relates to the field of display technology and, more particularly, relates to an array substrate and fabrication method thereof, and a display panel.

BACKGROUND

A metal oxide thin film transistor uses a metal oxide semiconductor layer as an active layer of the thin film transistor. Because of its optical properties such as a high carrier mobility, a low deposition temperature, and a high transparency, the metal oxide thin film transistor has become a prevailing display panel driving technology.

The display panels have relatively high requirements on the positive bias stability of the metal oxide thin film transistor disposed in the display region, and when the stability of the metal oxide thin film transistor in the display region is poor, display images may easily show issues such as residual images or uneven brightness of the display device. Accordingly, the positive bias stability of the metal oxide thin film transistor in the display region needs to be improved to enhance the display quality of the display panel.

Further, when the metal oxide thin film transistor disposed in the non-display region of the display panel is an N-type thin film transistor, often a threshold voltage higher than or equal to a certain threshold voltage value (e.g., 3V) is needed to ensure that the thin film transistor is in an "off" state when the voltage between the gate and source electrodes of the metal oxide thin film transistor is zero.

However, according to the present disclosure, it is found that the greater the threshold voltage of the metal oxide thin film transistor, the poorer the positive bias stability. Accordingly, the metal oxide thin film transistor may not simultaneously satisfy the requirements of the display panel regarding the positive bias stability and the threshold voltage.

The disclosed array substrate and fabrication method thereof, and display panel are directed to solving at least partial problems set forth above and other problems.

BRIEF SUMMARY OF THE DISCLOSURE

One aspect of the present disclosure provides an array substrate. The array substrate comprises a first thin film transistor including a metal oxide thin film transistor, and a second thin film transistor including an amorphous silicon thin film transistor. The first thin film transistor and the second thin film transistor are disposed above a substrate. The first thin film transistor is located in a display region of the array substrate, and the second thin film transistor is located in a peripheral circuit region of the array substrate.

Another aspect of the present disclosure provides a display panel including an array substrate. The array substrate comprises a first thin film transistor including a metal oxide thin film transistor, and a second thin film transistor including an amorphous silicon thin film transistor. The first thin film transistor and the second thin film transistor are disposed above a substrate. The first thin film transistor is located in a display region of the array substrate, and the second thin film transistor is located in a peripheral circuit region of the array substrate.

Another aspect of the present disclosure provides a fabrication method of an array substrate. The fabrication method includes forming a first thin film transistor and a second thin film transistor above a substrate. The first thin film transistor is a metal oxide thin film transistor, and the second thin film transistor is an amorphous silicon thin film transistor. The first thin film transistor is located in a display region of the array substrate, and the second thin film transistor is located in a peripheral circuit region of the array substrate Other aspects of the present disclosure can be understood by those skilled in the art in light of the description, the claims, and the drawings of the present disclosure.

BRIEF DESCRIPTION OF THE DRAWINGS

Other features, goals, and advantages of the present disclosure will become more apparent via a reading of detailed descriptions of non-limiting embodiments with reference to the accompanying drawings.

DETAILED DESCRIPTION

Figure 1:
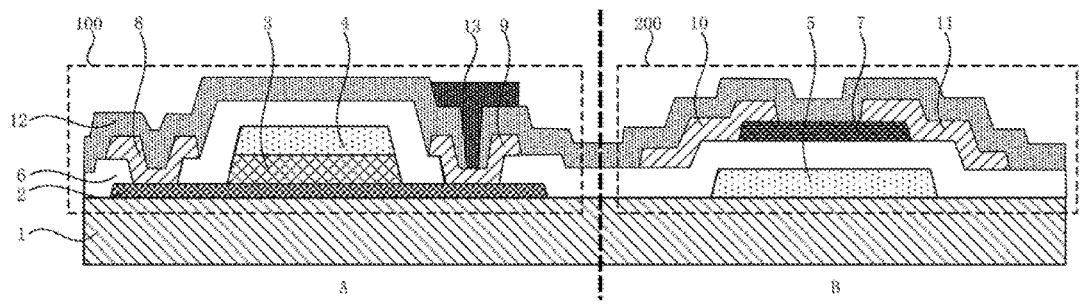
FIG. 1 illustrates a cross-sectional schematic view of an exemplary array substrate according to embodiments of the present disclosure.

Reference will be made in detail with reference to embodiments of the present disclosure as illustrated in the accompanying drawings and embodiments. It should be understood that, specific embodiments described herein are only for illustrative purposes, and are not intended to limit the scope of the present disclosure. In addition, for ease of description, accompanying drawings only illustrate a part of, but not entire structure related to the present disclosure.

As discussed above, a greater threshold voltage of the metal oxide thin film transistor often accompanies a poorer positive bias stability. Accordingly, the metal oxide thin film transistor often cannot simultaneously satisfy the requirements of a display panel regarding the positive bias stability and the threshold voltage.

Directed to solving at least partial problems set forth above and other problems, the present disclosure provides an improved array substrate including a first thin film transistor and a second thin film transistor. The first thin film transistor and the second thin film transistor are disposed above a substrate. The first thin film transistor includes a metal oxide thin film transistor, and the second thin film transistor includes an amorphous silicon thin film transistor. The first thin film transistor is disposed in a display region of the array substrate, and the second thin film transistor is located in a peripheral circuit region of the array substrate.

The metal oxide thin film transistor has advantages such as relatively high carrier mobility, uniform electrical performances, being transparent to visible light, a low processing temperature, and potential of scalable fabrication, etc. By applying the metal oxide thin film transistor to the display region of the array substrate, the pixel density, the aperture ratio, and the brightness of the display region may be effectively improved. Further, by improving the stability of the metal oxide thin film transistor, the display quality of the display panel may be improved, thereby avoiding occurrence of issues such as residual images or uneven brightness, etc.

The amorphous silicon thin film transistor is characterized by having a low cut-off current. That is, only a relatively low threshold voltage is needed to ensure that the voltage between the gate electrode and the source electrode of the amorphous silicon thin film transistor is zero, such that the amorphous silicon thin film transistor in a peripheral circuit of the array substrate may be in an "off" state to ensure normal operation of the peripheral circuit region of the array substrate.

By using a metal oxide thin film transistor in the display region of the array substrate and using a amorphous silicon thin film transistor in the peripheral circuit region of the array substrate, embodiments of the present disclosure may solve issue that the metal oxide thin film transistor cannot simultaneously satisfy the requirements of the display panel regarding the positive bias stability and the threshold voltage. Accordingly, the image display effect may be improved, and the stability and yield of the peripheral circuit region may be improved.

Optionally, the peripheral circuit region of the array substrate may include a vertical shift register (VSR), and a scanning signal may be provided to each row of pixels in the display region via the VSR. By disposing VSR in the peripheral circuit region of the array substrate, the number of peripheral driving chips and the number of corresponding connection lines may be reduced, the design space of layout wiring may be saved, and the fabrication cost of the display panel may be decreased. In particular, VSR may include a plurality of second thin film transistors. The plurality of second thin film transistors in the VSR may form a plurality of cascading shift registers. Each shift register may be connected to a corresponding scanning line and control the on-and-off of the first thin film transistors connected to the scanning line, thereby realizing scanning of each pixel in the display panel row by row.

Technical solutions in embodiments of the present disclosure will be described hereinafter with reference to the accompanying drawings as illustrated in embodiments of the present disclosure. Based on the embodiments of the present disclosure, other embodiments obtainable by those ordinarily skilled in the relevant art without creative effort shall all fall within the protection scope of the present disclosure.

FIG. 1 illustrates a cross-sectional schematic view of an exemplary array substrate according to embodiments of the present disclosure. As shown in FIG. 1, the array substrate may include a first thin film transistor 100 disposed in a display region A of the array substrate, and a second thin film transistor 200 disposed in a peripheral circuit region B of the array substrate. The first thin film transistor 100 may be a metal oxide thin film transistor, and the second thin film transistor 200 may be an amorphous silicon thin film transistor.

More specifically, the array substrate may include a substrate 1, a metal oxide semiconductor layer 2, an insulating layer 3, a first gate electrode 4, a second gate electrode 5, a second insulating layer 6, a amorphous silicon semiconductor layer 7, a first source electrode 8, a first drain electrode 9, a second source electrode 10, a second drain electrode 11, a third insulating layer 12, and a pixel electrode 13.

For example, the metal oxide semiconductor layer 2 may be disposed above the substrate 1 and located in a display region A of the array substrate. The first insulating layer 3 may be disposed above the metal oxide semiconductor layer 2. The first gate electrode 4 may be disposed above the first insulating layer 3 and located in the display region A of the array substrate.

Further, the second gate electrode 5 may be disposed above the substrate 1 and be located in a peripheral circuit region B of the array substrate. The second insulating layer 6 may be disposed above the first gate electrode 4, the second gate electrode 5, the metal oxide semiconductor layer 2, and the substrate 1. The amorphous silicon semiconductor layer 7 may be disposed above the second insulating layer 6 and be located in the peripheral circuit region B of the array substrate.

Further, the first source electrode 8, the first drain electrode 9, the second source electrode 10, and the second drain electrode 11 may be disposed above the second insulating layer 6. A first through-hole may be formed in a region of the second insulating layer 6 corresponding to the metal oxide semiconductor layer. The first source electrode 8 and the first drain electrode 9 may be connected to the metal oxide semiconductor layer 2 via the first through-hole, and the second source 10 and the second drain electrode 11 may be connected to the amorphous silicon semiconductor layer 7.

Further, the third insulating layer 12 may be disposed above the first source electrode 8, the first drain electrode 9, the second source electrode 10, the second drain electrode 11, and the second insulating layer 6. A second through-hole may be formed in a region of the third insulating layer 12 corresponding to first drain electrode 9. The pixel electrode 13 may be disposed above the third insulating 12, and the pixel electrode 13 may be connected to the first drain electrode 9 via the second through-hole.

Accordingly, the first thin film transistor 100 (e.g., the metal oxide thin film transistor) in the display region A of the array substrate may be a top-gate structure. That is, the first gate electrode 4 may be disposed above the metal oxide semiconductor layer 2. Further, the second thin film transistor 200 (e.g., the amorphous silicon thin film transistor) disposed in the peripheral circuit region B of the array substrate may be a bottom-gate structure. That is, the second gate electrode 5 may be disposed below the amorphous silicon semiconductor layer 7.

Further, the first gate electrode 4 of the first thin film transistor 100 (e.g., the metal oxide thin film transistor) may receive a scanning signal transmitted by a scanning line, and the first source electrode 8 may receive a data signal transmitted by a data line, thereby providing a working voltage to the pixel electrode 13.

Figure 10:
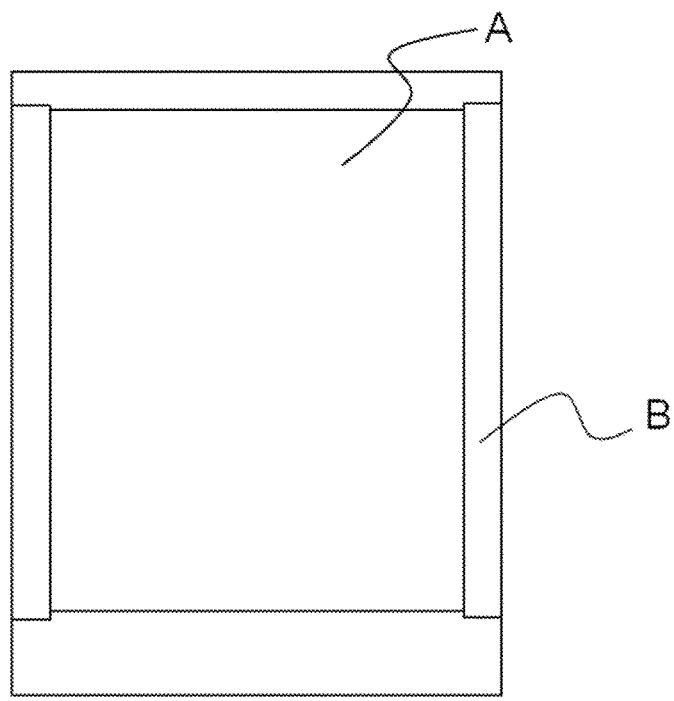
FIG. 10 illustrates a top view of an exemplary array substrate showing positions of a display region and a peripheral circuit region according to embodiments of the present disclosure.

FIG. 10 illustrates a top view of an exemplary array substrate showing positions of a display region A and a peripheral circuit region B according to embodiments of the present disclosure. As shown in FIG. 10, the array substrate may include a display region A and a non-display region surrounding the display region A. The non-display region may further include a peripheral circuit region B. For example, the peripheral circuit region B may be located on two sides of the display region A. Further, the peripheral circuit region B may include a vertical shift register (VSR), and the VSR may include a plurality of second thin film transistors (e.g., the amorphous silicon thin film transistor).

Figure 2:
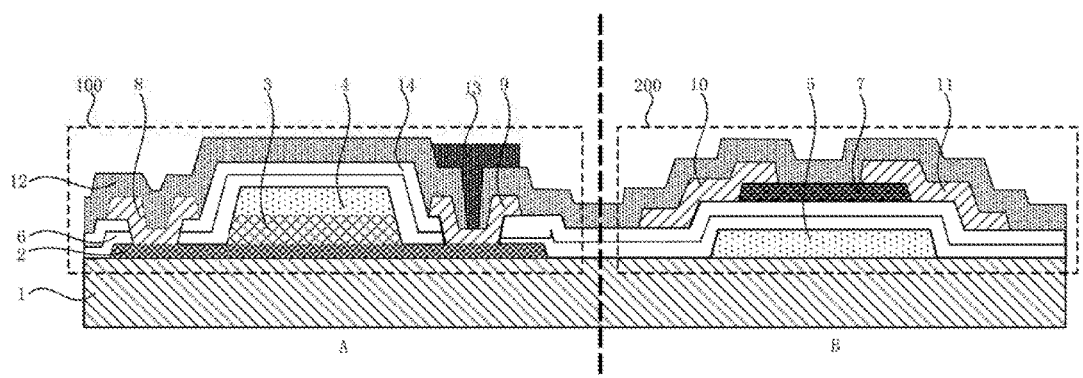
FIG. 2 illustrates a cross-sectional schematic view of another exemplary array substrate according to embodiments of the present disclosure.

FIG. 2 illustrates a cross-sectional schematic view of another exemplary array substrate according to embodiments of the present disclosure. Different from aforementioned embodiments, the array substrate illustrated in FIG. 2 may further include a fourth insulating layer 14.

In particular, the fourth insulating layer 14 may be disposed above the second insulating layer 6, and the fourth insulating layer 14 and the amorphous silicon semiconductor layer 7 may be formed continuously in a same chamber. Accordingly, the change of the fabrication chamber and the transmission of the sample may be avoided, the fabrication processes of the array substrate may be effectively simplified, and the fabrication period may be shortened, thereby improving a fabrication efficiency of the array substrate.

Optionally, a material of the second insulating layer 6 may be $SiO_2$ or $SiN_x$. Optionally, the material of the second insulating layer 6 may be $SiO_2$, and a material of the fourth insulating layer 14 may be $SiN_x$. The second insulating layer 6 may be made of $SiO_2$ and contact the metal oxide semiconductor layer 2, thereby avoiding impact of an insulating layer with a relatively high hydrogen content (e.g., $SiN_x$) on the electrical performance of the metal oxide semiconductor layer 2 in a fabrication process. The fourth insulating layer 14 may be made of $SiN_x$ and contact the amorphous silicon semiconductor layer 7. The fourth insulating layer 14 may be further used as a buffer passivation layer for the amorphous silicon semiconductor layer 7, thereby improving the film quality of the amorphous silicon semiconductor layer 7.

Optionally, a material of the first insulating layer 3 may be $SiO_2$, and a material of the third insulating layer 12 may be at least one of $SiO_2$ and $SiN_x$. The first insulating layer 3 may be made of $SiO_2$ and contact the metal oxide semiconductor layer 2, thereby avoiding the impact of the insulating layer with a relatively high hydrogen content (e.g., $SiN_x$) on the electrical performance of the metal oxide semiconductor layer 2. The third insulating layer 12 may be made of a stacking structure formed by $SiO_2$, or $SiN_x$, or a combination thereof, and contact the amorphous silicon semiconductor layer 7, and the third insulating layer 12 may be used as a buffer passivation layer of the amorphous silicon semiconductor layer 7, thereby improving the film quality of the amorphous silicon semiconductor layer 7.

Optionally, an active layer of the metal oxide thin film transistor (i.e., the metal oxide semiconductor layer 2 in FIG. 1 and FIG. 2) may be made a metal oxide formed by one or more elements selected from Zn, Ga, In, Sn, Al, Hf, C, B, N and S. For example, the active layer of the metal oxide thin film transistor may be made of Indium Gallium Zinc Oxide (IGZO). More specifically, the IGZO may be an amorphous oxide comprising indium, gallium, and zinc.

Further, the carrier mobility of IGZO may be relatively high, thereby improving a charge-discharge rate of the metal oxide thin film transistor towards the pixel electrode. A response rate of the pixels may be improved, thereby increasing the scanning rate of the pixels. Accordingly, the implementation of an ultra-high resolution may become possible. The active layer of the metal oxide thin film transistor may be, for example, formed by a method such as magnetron sputtering, etc. The present disclosure is not intended to limit the fabrication processing of the active layer of the metal oxide thin film transistor.

Figure 3:
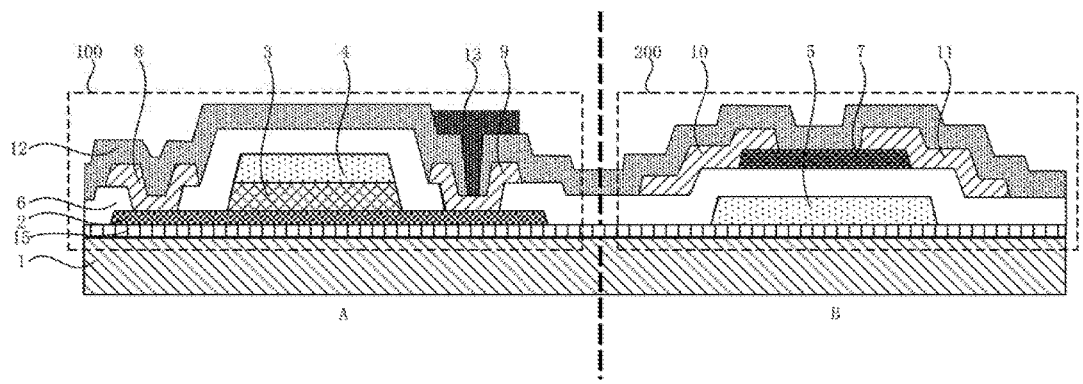
FIG. 3 illustrates a cross-sectional schematic view of another exemplary array substrate according to embodiments of the present disclosure.

FIG. 3 illustrates a cross-sectional schematic view of another exemplary array substrate according to embodiments of the present disclosure. Different from aforementioned embodiments, the array substrate illustrated in FIG. 3 may further include a buffer layer 15. In particular, the buffer layer 15 may be sandwiched between the metal oxide semiconductor layer 2 and the substrate 1, and between the second gate electrode 5 and the substrate 1. The buffer layer 15 may improve the film quality of the metal oxide semiconductor layer 2 and the gate electrode 5. For example, the buffer layer 15 may be formed by stacking of the $SiO_2$ thin films and the $SiN_x$ thin films. In particular, the $SiN_x$ thin film may be configured to contact the metal oxide semiconductor layer 2.

Optionally, if the disclosed array substrate is applied in an organic light-emitting display panel, the display region of the array substrate provided by embodiments of the present disclosure may include a plurality of pixel driving circuits. A pixel driving circuit may include at least two first thin film transistors and at least one capacitor. For example, FIG. 4 illustrates a structural schematic view of an exemplary pixel driving circuit according to embodiments of the present disclosure.

Figure 4:
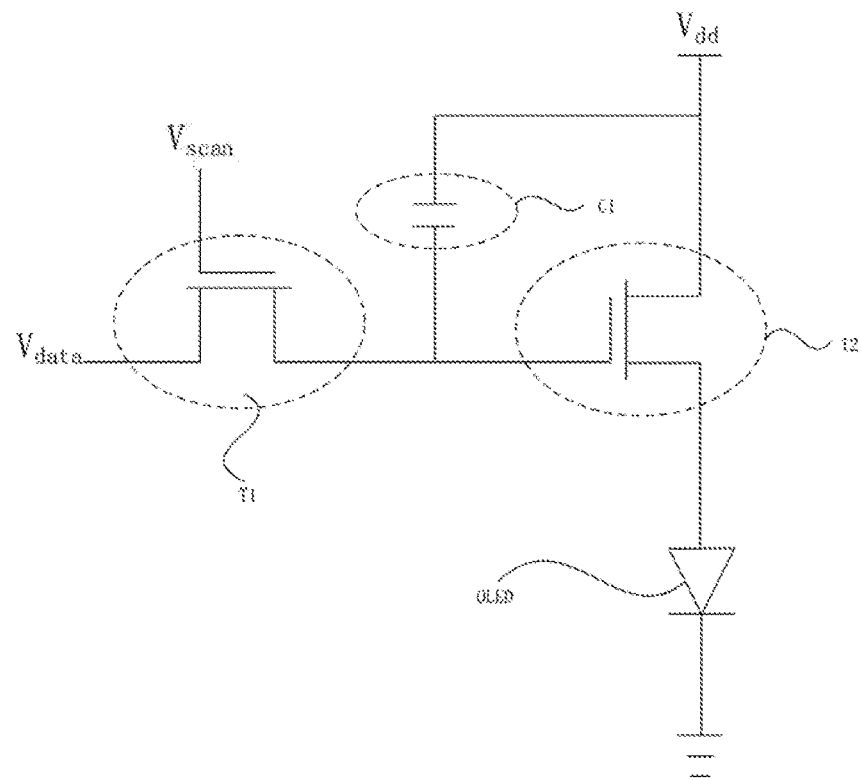
FIG. 4 illustrates a structural schematic view of an exemplary pixel driving circuit according to embodiments of the present disclosure.

As shown in FIG. 4, the pixel driving circuit may include two first thin film transistors and one capacitor. In particular, a first gate electrode of the first thin film transistor T1 may be connected to a scanning line $V_{scan}$, a first source electrode of the first thin film transistor T1 may be connected to a first gate electrode of another first thin film transistor T2, and a drain electrode of the first thin film transistor T1 may be connected to a data line $V_{data}$.

Further, a first electrode of the capacitor C1 may be connected to a first gate electrode of the first thin film transistor T2 and the first source electrode of the first thin film transistor T1, and a second electrode of the capacitor C1 may be connected to the first drain electrode of the first thin film transistor T2 and a working power source end $V_{dd}$. A first source electrode of the first thin film transistor T2 may be connected to an anode of an organic light-emitting display (OLED) panel.

Specifically, when the scanning line is selected, the first thin film transistor T1 may be turned on, the data voltage may charge the capacitor C1 via the first thin film transistor T1, and the voltage of the capacitor C1 may control a drain electrode current of the first thin film transistor T2. When the scanning line is not selected, the first thin film transistor T1 may be turned off, the electrical charges stored in the capacitor C1 may maintain a gate electrode voltage of the first thin film transistor T2. Accordingly, the first thin film transistor T2 may remain an "on" state, such that the OLED may be in a state controlled by a constant current.

FIG. 4 only illustrates a structural schematic view of a pixel driving circuit comprising two first thin film transistors and one capacitor. The present disclosure is, however, not intended to limit the number of the first thin film transistors and the number of capacitors included in the pixel driving circuit. For example, the pixel driving circuit of the array substrate may include three first thin film transistors and one capacitor.

Figure 5:
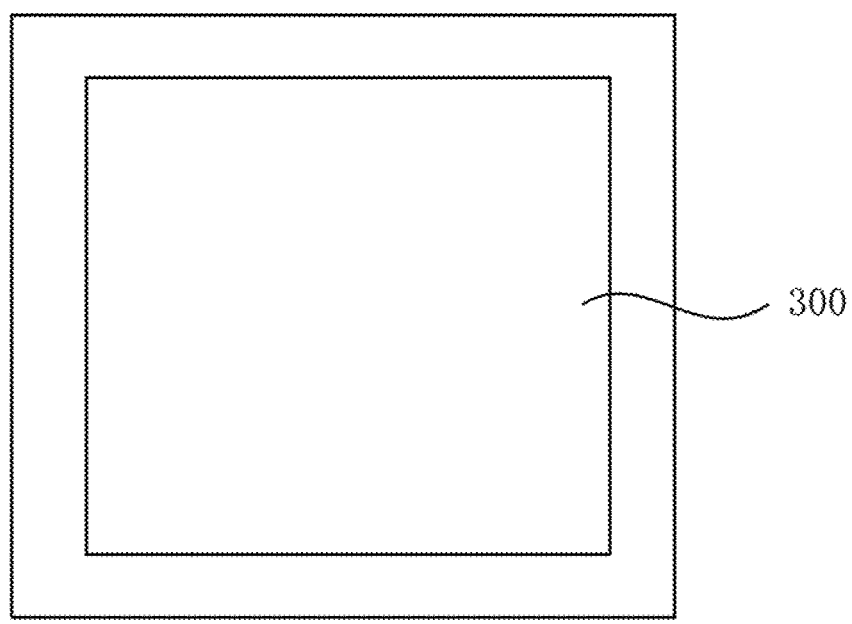
FIG. 5 illustrates a structural schematic view of an exemplary display panel according to embodiments of the present disclosure.

The present disclosure also provides a display panel. FIG. 5 illustrates a structural schematic view of an exemplary display panel according to embodiments of the present disclosure. As shown in FIG. 5, the display panel may include an array substrate 300 according to the aforementioned embodiments.

Because the disclosed display panel includes an array substrate illustrated in the aforementioned embodiments, the disclosed display panel may have beneficial effects described in the aforementioned embodiments, which are not described herein. For example, the disclosed display panel may be a liquid crystal display panel, or an organic light-emitting display panel OLED. Further, the organic light-emitting display panel may be applied to any product or component having a display function, such as a notebook, a tablet, or a display device, etc.

Further, the present disclosure also provides a fabrication method of an array substrate, and the method may include forming a first thin film transistor and a second thin film transistor above a substrate. The first thin film transistor may be a metal oxide thin film transistor, and the second thin film transistor may be an amorphous silicon thin film transistor. The first thin film transistor may be disposed in a display region of the array substrate, and the second thin film transistor may be disposed in a peripheral circuit region of the array substrate.

By disposing the metal oxide thin film transistor in the display region of the array substrate and disposing the amorphous silicon thin film transistor in the peripheral circuit region of the array substrate, the present disclosure may solve issues that the metal oxide thin film transistor cannot satisfy requirements of the display panel regarding the positive bias stability and the threshold voltage. Thus, the image display effect may be improved, and the stability and yield of the peripheral circuit region may be improved.

Figure 6:
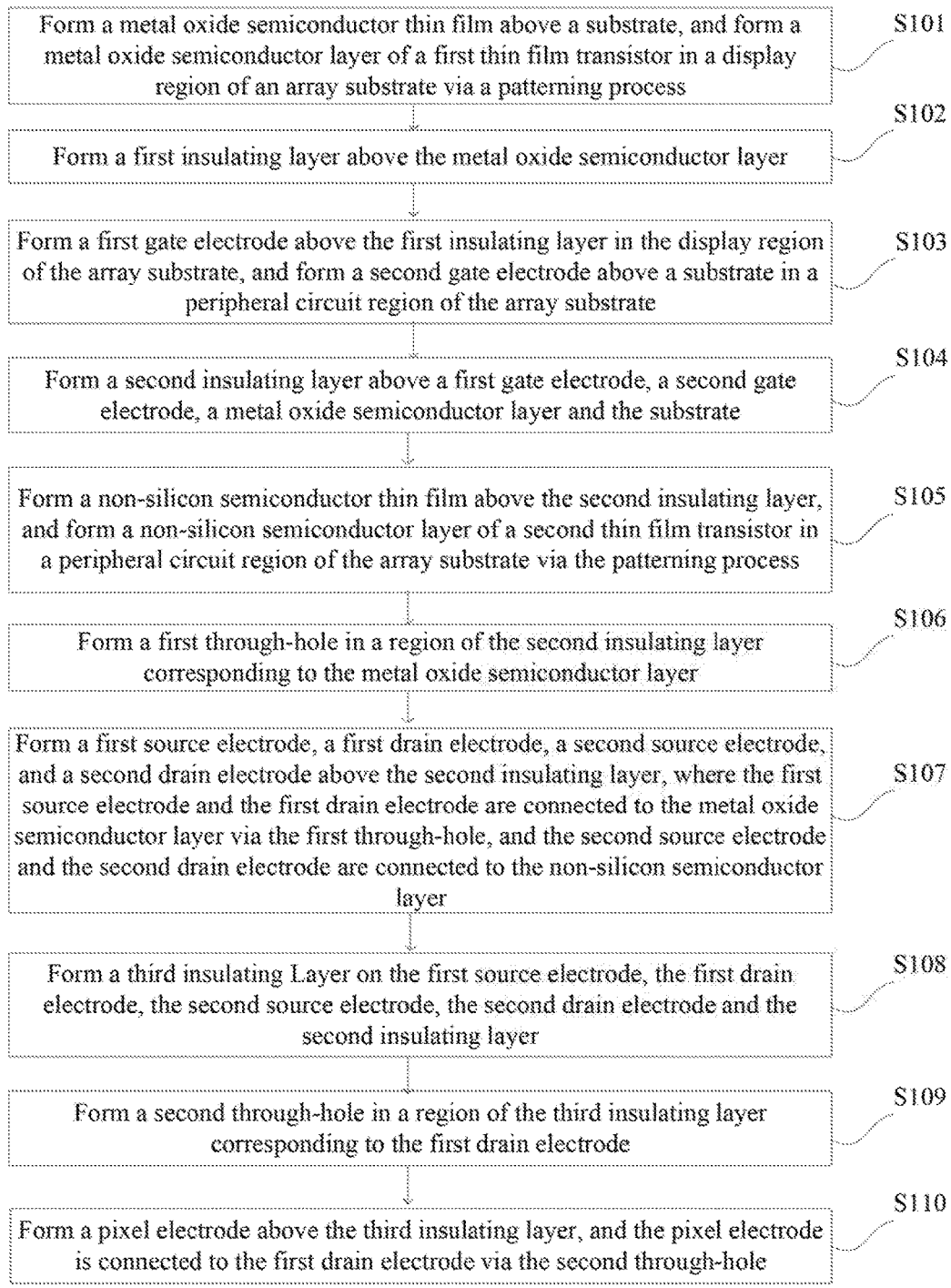
FIG. 6 illustrates a flow chart of an exemplary fabrication method of an array substrate according to embodiments of the present disclosure.

FIG. 6 illustrates a flow chart of an exemplary fabrication method of an array substrate according to embodiments of the present disclosure. FIG. 7A-FIG. 7J illustrate cross-sectional schematic views of each step in FIG. 6. As shown in FIG. 6, the method may include the following steps.

Step S101: forming a metal oxide semiconductor thin film above a substrate, and forming a metal oxide semiconductor layer of a first thin film transistor in a display region of the array substrate via a patterning process.

Figure 7A:
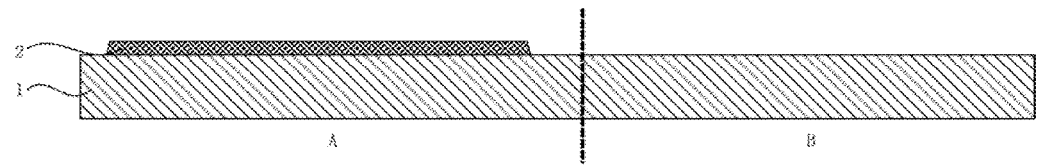
FIG. 7A-FIG. 7J illustrate cross-sectional schematic views of each step in FIG. 6.

For example, a metal oxide semiconductor thin film may be disposed above the substrate via a method, such as a physical or chemical vapor deposition (CVD). A patterning process may be performed on the metal oxide semiconductor, including, for example, spin-coating of a photo-resist, exposure, developing, and etching. Referring to FIG. 7A, a metal oxide semiconductor layer 2 may be formed above the substrate 1 in the display region A of the array substrate. The material of the metal oxide semiconductor layer 2 may be, for example, IGZO.

Step S102: forming a first semiconductor layer above the metal oxide semiconductor layer.

Figure 7B:
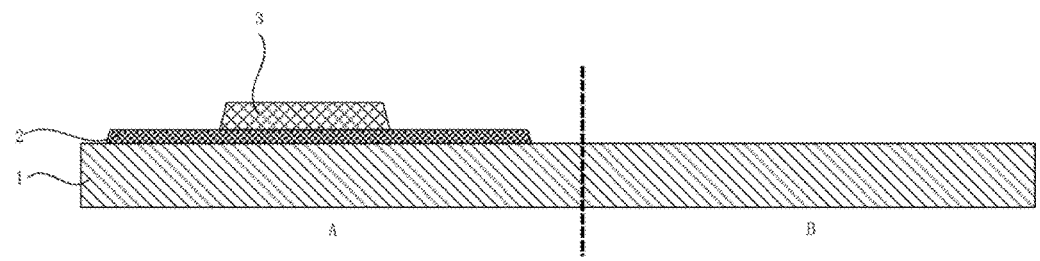

Referring to FIG. 7B, a first insulating layer 3 may be disposed above the metal oxide semiconductor layer 2. The first insulating layer 3 may be made of a material such as $SiO_2$. Optionally, a plasma enhanced chemical vapor deposition method may be used to fabricate the first insulating layer 3, and the fabrication temperature may be configured to be lower than 220° C. The plasma enhanced chemical vapor deposition needs a relatively low deposition, thereby having a relatively small effect on the structure and physical properties of a film layer. Accordingly, the thickness and composition of the formed film layer may be relatively uniform, the film layer may be relatively dense, and the adhesion may be strong.

Step S103: forming a first gate electrode above the first insulting layer in the display region of the array substrate, and forming a second gate electrode above the substrate in a peripheral circuit region of the array substrate.

Figure 7C:
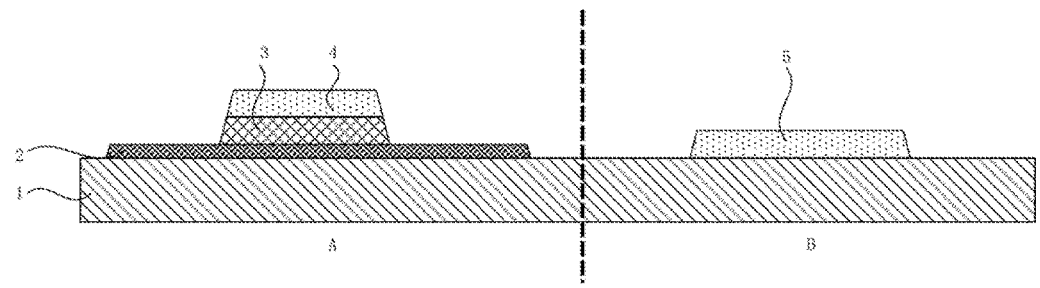

Referring to FIG. 7C, for example, a layer of gate electrode metal material may be disposed above the first insulating layer 3 in the display region A of the array substrate and on the substrate 1 in the peripheral circuit region B of the array substrate via a method of sputtering or evaporation. A patterning process may be performed on the gate electrode metal material to form a first gate electrode 4 and a second gate electrode 5.

Step S104: forming a second insulating layer on the first gate electrode, the second gate electrode, the metal oxide semiconductor layer, and the substrate.

Figure 7D:
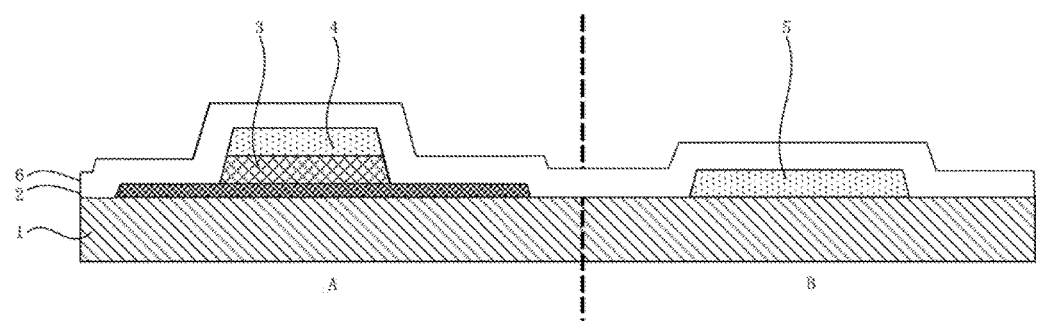

Referring to FIG. 7D, a second insulating layer 6 may be disposed above the first gate electrode 4, the second gate electrode 5, the metal oxide semiconductor layer 2, and the substrate 1. The material of the second insulating layer 6 may be, for example, $SiO_2$ or $SiN_x$. Optionally, a plasma enhanced chemical vapor deposition (PECVD) method may be applied to form the second insulating layer 6, and the fabrication temperature may be lower than or equal to 220° C.

Step S105: forming an amorphous silicon semiconductor thin film above the second insulating layer, and forming an amorphous silicon semiconductor layer of a second thin film transistor in the peripheral circuit region of an array substrate via a patterning process.

Figure 7E:
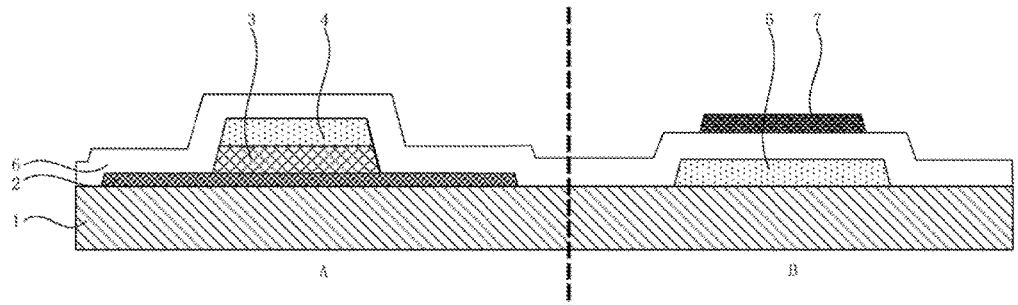

Referring to FIG. 7E, an amorphous silicon semiconductor thin film 7 may be disposed above the second insulating layer 6. A patterning process may be performed on the amorphous silicon semiconductor thin film 7, such that an amorphous silicon semiconductor thin film pattern (i.e., the amorphous silicon semiconductor layer 7) may be formed on the second insulating layer 6 in the peripheral circuit region of the array substrate. Optionally, the present disclosure may form a amorphous silicon semiconductor thin film via a plasma enhanced chemical vapor deposition method, and the fabrication temperature may be configured to be lower than or equal to 300° C.

Because the amorphous silicon semiconductor thin film is made of amorphous silicon, when the fabrication temperature increases, the crystallization degree of the amorphous silicon semiconductor and the mobility may be increased. However, an excess temperature may easily affect the electrical performance of the formed metal oxide semiconductor layer 2. Thus, the fabrication temperature of the amorphous silicon semiconductor thin film may be selected to be lower than or equal to 300° C.

Step S106: forming a first through-hole in a region of the second insulating layer corresponding to the metal oxide semiconductor layer.

Figure 7F:
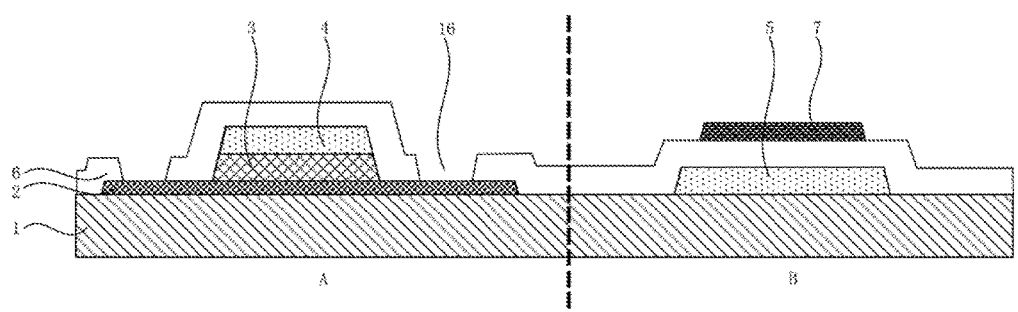

Referring to FIG. 7F, a first through-hole 16 may be formed in the region of the second insulating layer 6 corresponding to the metal oxide semiconductor layer 2. For example, the first through-hole 16 may be formed by using a mask plate via a photo-etching method.

Step S107: forming a first source electrode, a first drain electrode, a second source electrode, and a second drain electrode above the second insulating layer, where the first source electrode and the first drain electrode are connected to the metal oxide semiconductor layer via the first through-hole, and the second source electrode and the second drain electrode are connected to the amorphous silicon semiconductor layer.

Figure 7G:
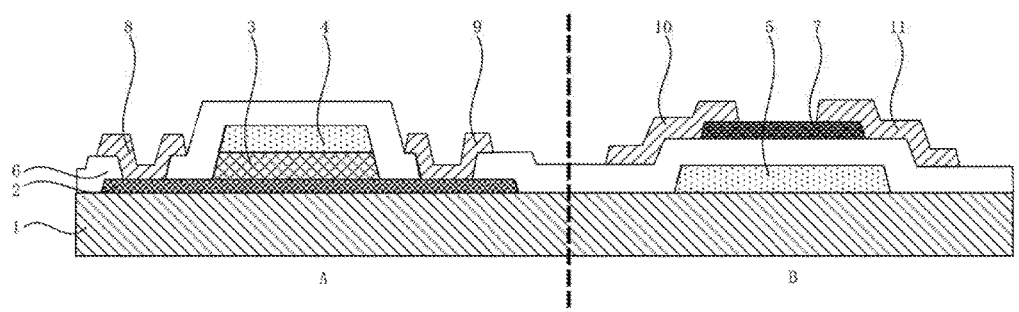

Referring to FIG. 7G, a first source electrode 8, a first drain electrode 9, a second source electrode 10, and a second drain electrode 11 may be disposed above the second insulating layer 6. In particular, the first source electrode 8 and the first drain electrode 9 may be connected to the metal oxide semiconductor layer 2 via the first through-hole, and the second source electrode 10 and the second drain electrode 11 may be connected to the amorphous silicon semiconductor layer 7.

Step S108: forming a third insulating layer above the first source electrode, the first drain electrode, the second source electrode, the second drain electrode, and the second insulating layer.

Figure 7H:
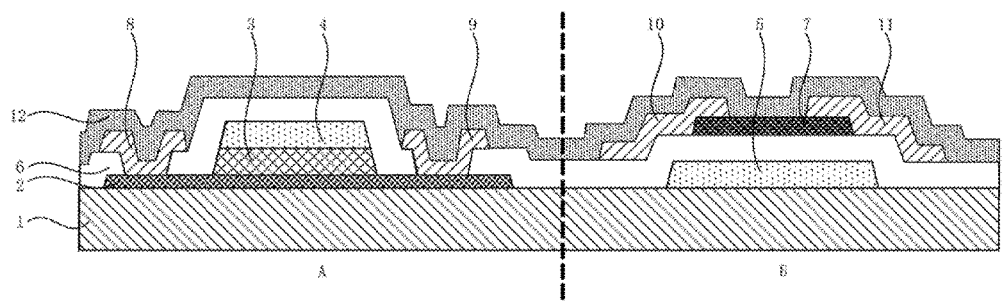

Referring to FIG. 7H, a third insulating layer 12 may be disposed above the first source electrode 8, the first drain electrode 9, the second source electrode 10, the second drain electrode 11, and the second insulating layer 6. A material of the third insulating layer 12 may be, for example, made of $SiO_2$, $SiN_x$, or a stacking structure formed by $SiO_2$ and $SiN_x$. Optionally, the third insulating layer 12 may be formed via a plasma enhanced chemical vapor deposition method, and the fabrication temperature may be configured to be lower than or equal to 300° C.

Step S109: forming a second through-hole in a region of the third insulating layer corresponding to the first drain electrode.

Figure 7I:
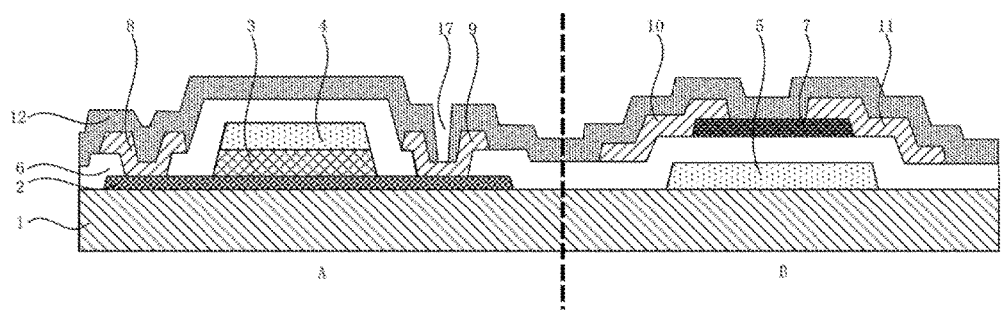

Referring to FIG. 7I, a second through-hole 17 may be formed in a region of the third insulating layer 12 corresponding to the first drain electrode 9. For example, the second through-hole 17 may be formed using a mask plate via a photo-etching method.

Step S110: forming a pixel electrode above the third insulating layer, where the pixel electrode is connected to the first drain electrode via the second through-hole.

Figure 7J:
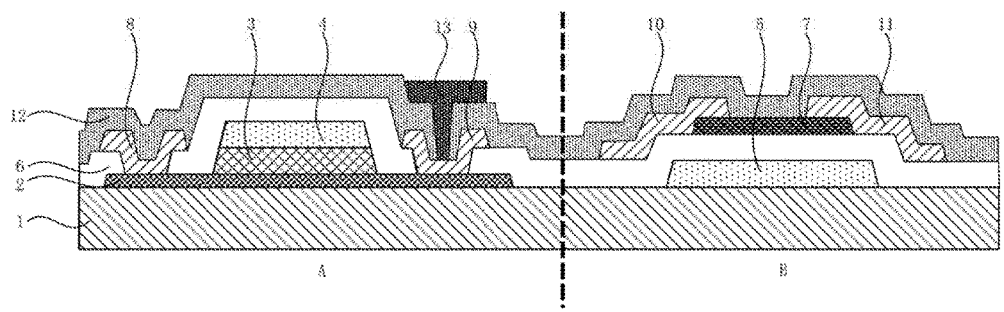

Referring to FIG. 7J, a pixel electrode 13 may be disposed above the third insulating layer 12, and the pixel electrode 13 may be connected to the first drain electrode 9 via a second through-hole.

Figure 8:
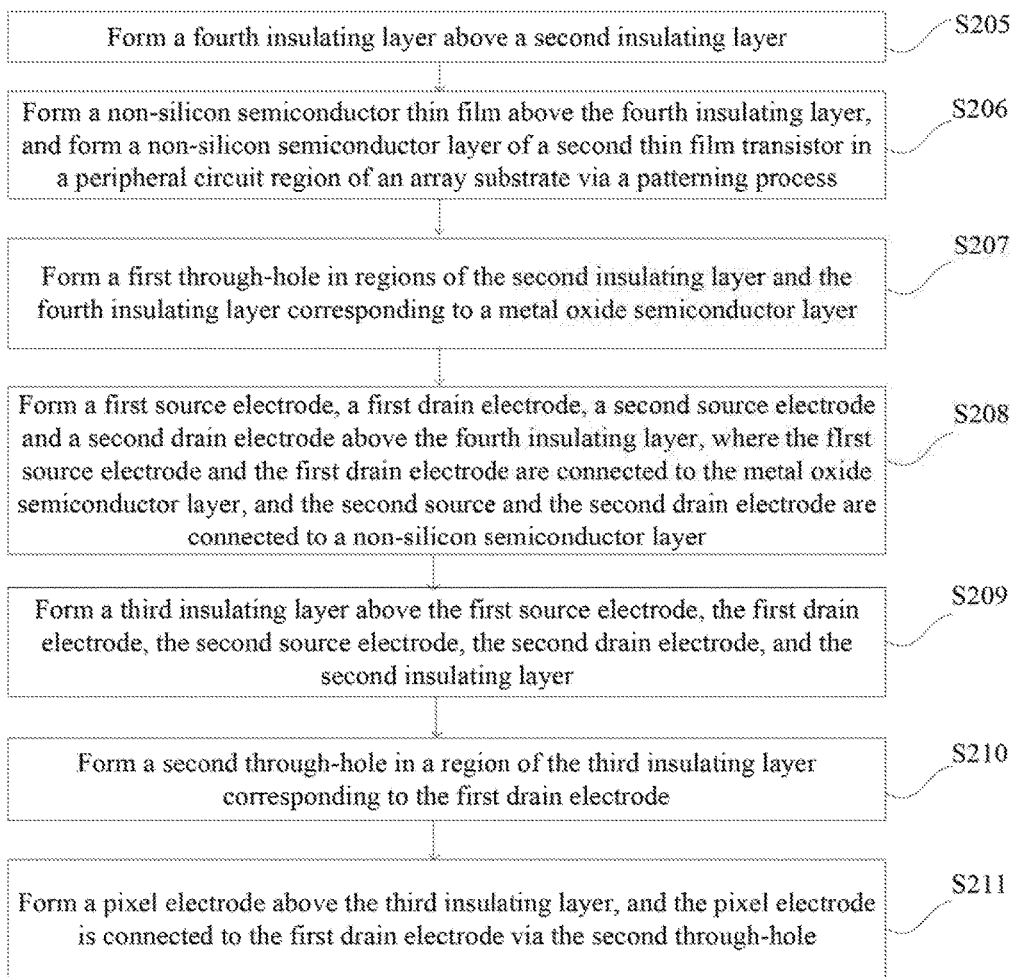
FIG. 8 illustrates a flow chart of Step 205-Step 211 in another exemplary fabrication method of an array substrate according to embodiments of the present disclosure.

In another embodiment, FIG. 8 illustrates a flow chart of Step 205-Step 211 in another exemplary fabrication method of an array substrate according to embodiments of the present disclosure. FIG. 9A-FIG. 9G illustrate cross-sectional views of each step in FIG. 8 according to embodiments of the present disclosure. Based on the aforementioned embodiments, the disclosed fabrication method of an array substrate may include the following steps.

Step S201: forming a metal oxide semiconductor thin film above a substrate, and forming a metal oxide semiconductor layer of a first thin film transistor in a display region of an array substrate via a patterning process.

Step S202: forming a first insulating layer above the metal oxide semiconductor layer.

Step S203: forming a first gate electrode above the first insulating layer in the display region of the array substrate, and forming a second gate electrode above the substrate in a peripheral circuit region of the array substrate.

Step S204: forming a second insulating layer above the first gate electrode, the second gate electrode, the metal oxide semiconductor layer, and the substrate.

The cross-sectional schematic views in Step S201-Step S204 may be similar to the cross-sectional schematic views illustrated in Step S101-Step S104, which are not repeatedly provided herein. The fabrication method of an array substrate may further include the following steps.

Step S205: forming a fourth insulating layer above the second insulating layer.

Figure 9A:
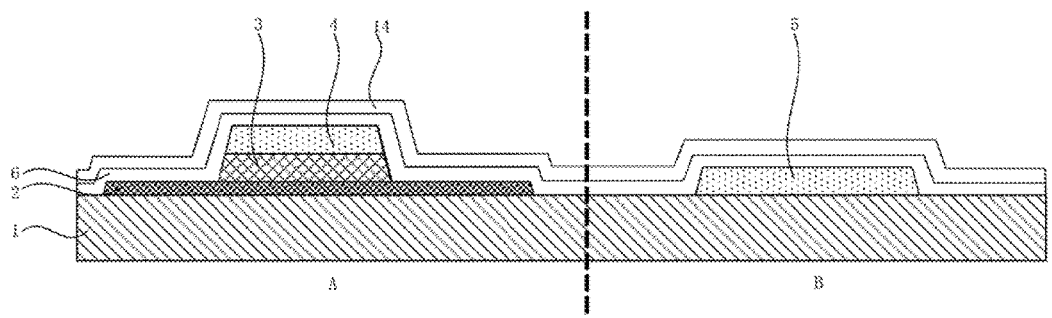
FIG. 9A-FIG. 9G illustrate cross-sectional views of each step in FIG. 8 according to embodiments of the present disclosure.

Referring to FIG. 9A, a fourth insulating layer 14 may be disposed above the second insulating layer 6. A material of the fourth insulating layer may be $SiN_x$. Optionally, the fourth insulating layer may be formed using a method of plasma enhanced chemical vapor deposition, and a fabrication temperature may be lower than or equal to 300° C.

Step S206: forming an amorphous silicon semiconductor thin film above the fourth insulating layer, and forming an amorphous silicon semiconductor layer of a second thin film transistor in the peripheral circuit region of the array substrate via a patterning process.

Figure 9B:
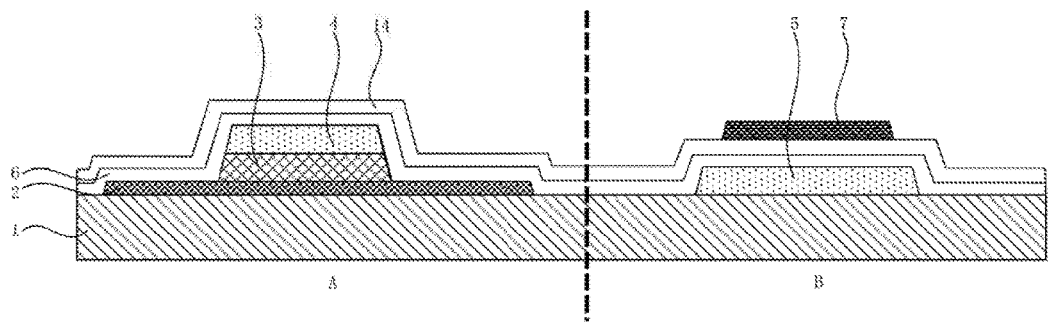

Referring to FIG. 9B, an amorphous silicon semiconductor thin film may be disposed above the fourth insulating layer 14, and via a patterning process, an amorphous silicon semiconductor layer 7 of a second thin film transistor may be formed in the peripheral circuit region B of the array substrate. Optionally, the amorphous silicon semiconductor thin film may be formed using a method of plasma enhanced chemical vapor deposition, and the fabrication temperature may be lower than or equal to 300° C.

For example, the amorphous silicon semiconductor thin film and the fourth insulating layer 14 may be formed in the same chamber, such that the change of the fabrication chamber and the transmission of the sample may be avoided. Further, the fabrication process of the array substrate may be effectively simplified, and the fabrication period may be shortened, thereby improving the fabrication efficiency of the array substrate.

Step S207: forming a first through-hole in a region of the second insulating layer and the fourth insulating layer corresponding to the metal oxide semiconductor layer.

Figure 9C:
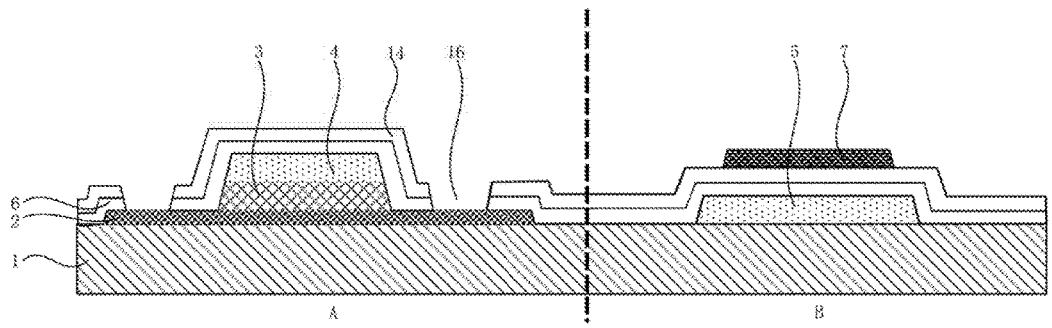

Referring to FIG. 9C, a first through-hole 16 may be formed in a region of the second insulating layer 6 and the fourth insulating layer 14 corresponding to the metal oxide semiconductor layer 2. For example, the first through-hole 16 may be formed using a mask plate via a photo-etching method.

Step S208, forming a first source electrode, a first drain electrode, a second source electrode, and a second drain electrode above the fourth insulating layer, where the first source electrode and the first drain electrode are connected to the metal oxide semiconductor layer via the first through-hole, and the second source electrode and the second drain electrode are connected to the amorphous silicon semiconductor layer.

Figure 9D:
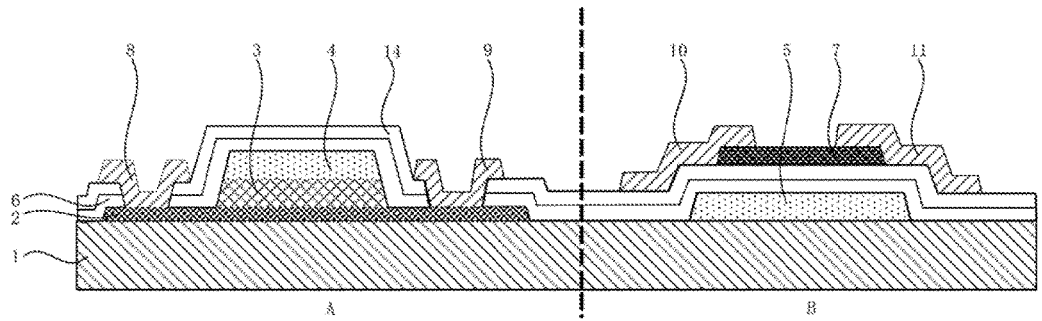

Referring to FIG. 9D, a first source electrode 8, a first drain electrode 9, a second source electrode 10, and a second drain electrode 11 may be disposed above the fourth insulating layer. In particular, the first source electrode 8 and the first drain electrode 9 may be connected to the metal oxide semiconductor layer 2 via the first through-hole, and the second source electrode 10 and the second drain electrode 11 may be connected to the amorphous silicon semiconductor layer.

Step S209, forming a third insulating layer above the first source electrode, the first drain electrode, the second source electrode, the second drain electrode, and the second insulating layer.

Figure 9E:
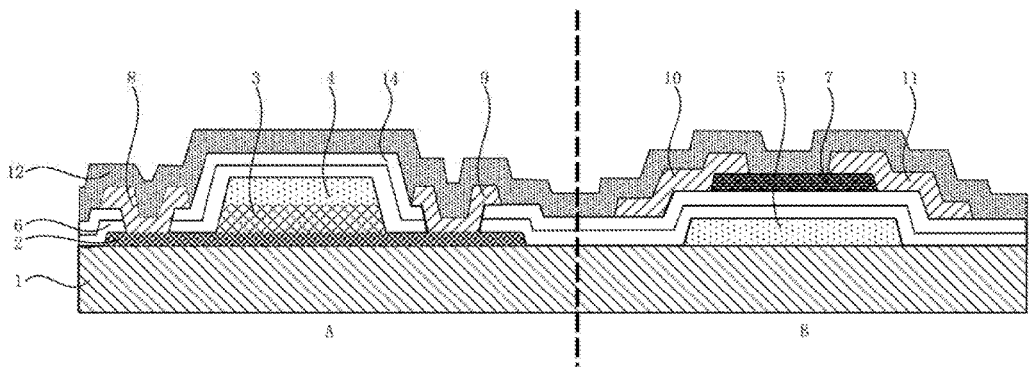

Referring to FIG. 9E, a third insulating layer may be disposed above the first source electrode 8, the first drain electrode 9, the second source electrode 10, the second drain electrode 11, and the second insulating layer. The third insulating layer 12 may be, for example, made of SiO$_2$ or SiN$_x$, or a stacking structure made of SiO$_2$ and SiN$_x$. Optionally, the third insulating layer 12 may be formed via a plasma enhanced chemical vapor deposition method, and the fabrication temperature may be configured to be lower than or equal to 300° C.

Step S210: forming a second through-hole in a region of the third insulating layer corresponding to the first drain electrode.

Figure 9F:
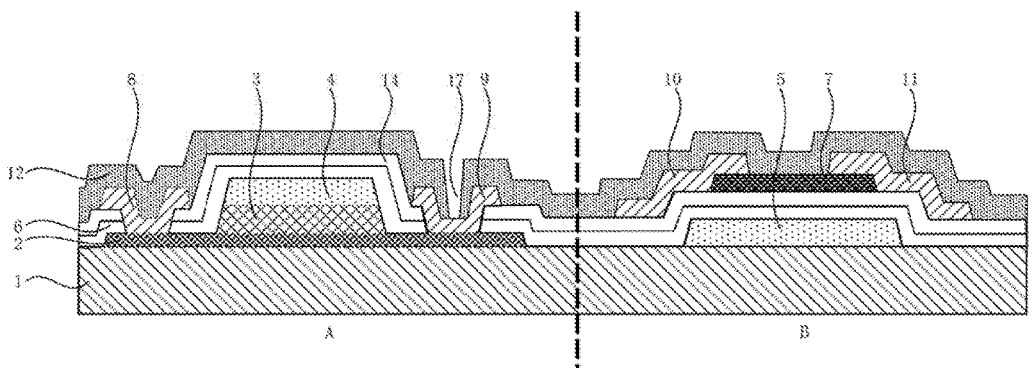

Referring to FIG. 9F, a second through-hole 17 may be formed in a region of the third insulating layer 12 corresponding to the first drain electrode 9. For example, the second through-hole 17 may be formed using a mask plate via a photo-etching method.

Step S210: forming a pixel electrode above the third insulating layer, where the pixel electrode is connected to the first drain electrode via the second through-hole.

Figure 9G:
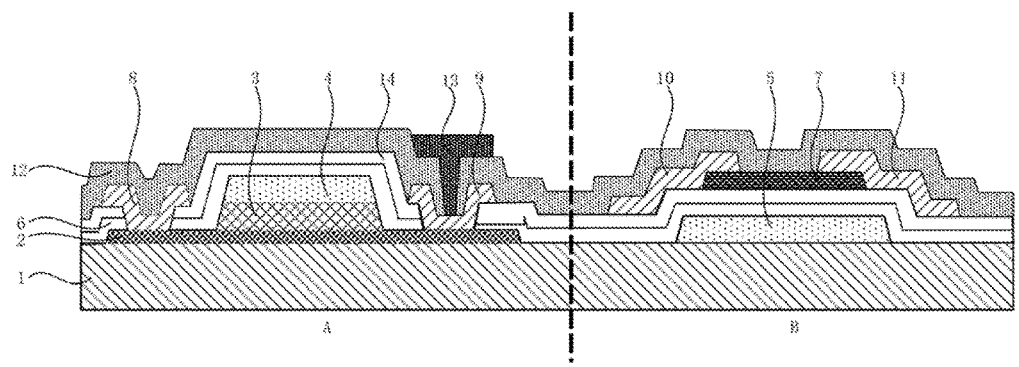

Referring to FIG. 9G, a pixel electrode 13 may be disposed above the third insulating layer 12, and the pixel electrode 13 is connected to the first drain electrode 9 via the second through-hole.

Optionally, before a metal oxide semiconductor thin film is disposed above the substrate 1, a buffer layer may be disposed above the substrate 1, and the metal oxide semiconductor thin film and the second gate electrode 5 may be disposed above the buffer layer. The buffer layer may improve the film quality of the metal oxide semiconductor layer 2 and the second gate electrode 5. For example, the buffer layer may be formed by stacking of a SiO$_2$ thin film and a SiN$_x$ thin film. In particular, the SiN$_x$ thin film may be configured to contact the metal oxide semiconductor layer 2.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. An array substrate, comprising:
a first thin film transistor including a metal oxide thin film transistor; and
a second thin film transistor including an amorphous silicon thin film transistor,
wherein the first thin film transistor and the second thin film transistor are disposed above a substrate,
the first thin film transistor is located in a display region of the array substrate, and
the second thin film transistor is located in a peripheral circuit region of the array substrate,
wherein the first thin film transistor includes a metal oxide semiconductor layer, a first gate electrode, a first source electrode and a first drain electrode,
the second thin film transistor includes an amorphous silicon semiconductor layer, a second gate electrode, a second source electrode and a second drain electrode,
a first insulating layer is disposed between the metal oxide semiconductor layer and the first gate electrode,
a second insulating layer is disposed above the first gate electrode, the second gate electrode, the metal oxide semiconductor layer, and the substrate, and
the amorphous silicon semiconductor layer, the first source electrode, the first drain electrode, the second source electrode, and the second drain electrode are disposed above the second insulating layer.

2. The array substrate according to claim 1, wherein:
the peripheral circuit region of the array substrate includes a vertical shift register (VSR), and the VSR includes a plurality of second thin film transistors.

3. The array substrate according to claim 1, further comprising:
a buffer layer, wherein the buffer layer is disposed between the metal oxide semiconductor layer and the substrate, and between the second gate electrode and the substrate.

4. The array substrate according to claim 1, wherein:
an active layer of the metal oxide thin film transistor includes a metal oxide comprising one or a plurality of Zn, Ga, In, Sn, Al, Hf, C, B, N, and S.

5. The array substrate according to claim 1, wherein:
the display region of the array substrate includes a plurality of pixel driving circuits, and
a pixel driving circuit includes at least two first thin film transistors and at least one capacitor.

6. An array substrate, comprising:
a first thin film transistor including a metal oxide thin film transistor; and
a second thin film transistor including an amorphous silicon thin film transistor,
wherein the first thin film transistor and the second thin film transistor are disposed above a substrate,
the first thin film transistor is located in a display region of the array substrate, and
the second thin film transistor is located in a peripheral circuit region of the array substrate,
wherein the array substrate further comprises:
a metal oxide semiconductor layer disposed above the substrate and located in the display region of the array substrate;
a first insulating layer disposed above the metal oxide semiconductor layer;
a first gate electrode and a second gate electrode, wherein the first gate electrode is disposed above the first insulating layer and located in the display region of the array substrate, and the second gate electrode is disposed on the substrate and located in the peripheral circuit region of the array substrate;
a second insulating layer disposed above the first gate electrode, the second gate electrode, the metal oxide semiconductor layer, and the substrate;
an amorphous silicon semiconductor layer disposed above the second insulating layer and located in the peripheral circuit region of the array substrate;
a first source electrode, a first drain electrode, a second source electrode, and a second drain electrode all disposed above the second insulating layer, wherein a first through-hole is formed in a region of the second insulating layer corresponding to the metal oxide semiconductor layer, the first source electrode and the first drain electrode are connected to the metal oxide semiconductor layer via the first through-hole, and the second source and the second drain electrode are connected to the amorphous silicon semiconductor layer;
a third insulating layer disposed above the first source electrode, the first drain electrode, the second source electrode, the second drain electrode, and the second insulating layer, wherein a second through-hole is formed in a region in the third insulating layer corresponding to first drain electrode; and
a pixel electrode disposed above the third insulating layer, wherein the pixel electrode is connected to the first drain electrode via the second through-hole.

7. The array substrate according to claim 6, further comprising:
a fourth insulating layer disposed on the second insulating layer, wherein the fourth insulating layer and the amorphous silicon semiconductor layer are formed in a same chamber.

8. The array substrate according to claim 7, wherein the material of the second insulating layer is $SiO_2$, and a material of the fourth insulating layer is $SiN_x$.

9. The array substrate according to claim 6, wherein a material of the second insulating layer is $SiO_2$ or $SiN_x$.

10. The array substrate according to claim 6, wherein a material of the first insulating layer is $SiO_2$, and a material of the third insulating layer is at least one of $SiO_2$ and $SiN_x$.

11. A display panel comprising an array substrate, wherein the array substrate includes:
a first thin film transistor including a metal oxide thin film transistor; and
a second thin film transistor including an amorphous silicon thin film transistor,
wherein the first thin film transistor and the second thin film transistor are disposed above a substrate,
the first thin film transistor is located in a display region of the array substrate, and
the second thin film transistor is located in a peripheral circuit region of the array substrate,
wherein the first thin film transistor includes a metal oxide semiconductor layer, a first gate electrode, a first source electrode and a first drain electrode,
the second thin film transistor includes an amorphous silicon semiconductor layer, a second gate electrode, a second source electrode and a second drain electrode,
a first insulating layer is disposed between the metal oxide semiconductor layer and the first gate electrode,
a second insulating layer is disposed above the first gate electrode, the second gate electrode, the metal oxide semiconductor layer, and the substrate, and
the amorphous silicon semiconductor layer, the first source electrode, the first drain electrode, the second source electrode, and the second drain electrode are disposed above the second insulating layer.

12. The display panel according to claim 11, wherein the display panel is an organic light-emitting display panel.

* * * * *